United States Patent
Ootake et al.

[11] Patent Number: 6,011,629
[45] Date of Patent: Jan. 4, 2000

[54] METHOD OF POSITIONAL ALIGNMENT OF SUBSTRATE AND SCREEN MASK IN ELECTRICAL PASTE SCREEN PRINTING

[75] Inventors: Yuuji Ootake, Kurume; Kunihiko Tokita; Takahiro Noda, both of Kasuga; Hirosi Murata, Saga-ken, all of Japan

[73] Assignee: Matsushita Electric Industrial Co., Ltd., Osaka, Japan

[21] Appl. No.: 09/245,864

[22] Filed: Feb. 8, 1999

[30] Foreign Application Priority Data

Mar. 2, 1998 [JP] Japan .................................. 10-049144

[51] Int. Cl.$^7$ .................................................. G01B 11/00
[52] U.S. Cl. ............................................. 356/400; 356/401
[58] Field of Search .................... 356/363, 399, 356/400, 401

[56] References Cited

U.S. PATENT DOCUMENTS 5,870,201  2/1999  Bae ........................................... 356/401

*Primary Examiner*—Robert H. Kim
*Attorney, Agent, or Firm*—Stevens, Davis, Miller & Mosher, L.L.P.

[57] ABSTRACT

In a method of automatic positional alignment of substrate and screen mask in electrical paste screen printing, the coordinates (X1, Y1), (X2, Y2) of points A, B on a substrate 10 are obtained with a first camera, while the coordinates (X3, Y3), (X4, Y4) of points A', B' on a screen mask 33 are obtained with a second camera. Then, the coordinates of the middle point P1 between the points A and B, and the coordinates of the middle point P2 between the points A' and B' are obtained, based on the results of which positional discrepancies $\Delta X$, $\Delta Y$ between the substrate 10 and the screen mask 33 in the directions of X and Y are obtained. Subsequently, the substrate 10 is rotated horizontally with the middle points P1 and P2 superposed until a line segment L1 connecting the points A and B coincides with a line segment L2 connecting the points A' and B', as a result of which a positional discrepancy $\theta$ in the direction of horizontal rotation is obtained. If the positional discrepancies $\Delta X$, $\Delta Y$ and $\theta$ are obtained, the substrate 10 and the screen mask 33 are aligned with each other based on the obtained results of calculation, and then it is judged whether or not the positional alignment is successful after observation of the points A and A'.

4 Claims, 7 Drawing Sheets

FIG.5A
| SUBSTRATE MARK | X-COORDINATE AXIS | Y-COORDINATE AXIS | CONFIGURATION | SIZE |
|---|---|---|---|---|
| A POINT | X1 | Y1 | ○ | φ1mm |
| B POINT | X2 | Y2 | ○ | φ1mm |
FIG.5B
| MASK MARK | X-COORDINATE AXIS | Y-COORDINATE AXIS | CONFIGURATION | SIZE |
|---|---|---|---|---|
| A POINT | X3 | Y3 | ○ | φ1mm |
| B POINT | X4 | Y4 | ○ | φ1mm |
FIG.5C
| X | Y | θ |
|---|---|---|
| ΔX | ΔY | θ |
FIG.9A
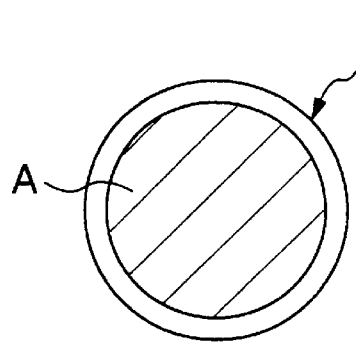
FIG.9B
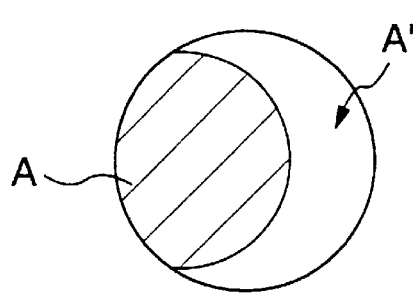

METHOD OF POSITIONAL ALIGNMENT OF SUBSTRATE AND SCREEN MASK IN ELECTRICAL PASTE SCREEN PRINTING

BACKGROUND OF THE INVENTION

This invention relates to a method of positional alignment of substrate and screen mask in screen printing of electrical paste such as cream solder, conductive paste and so on.

On the substrates on which electronic parts are to be mounted, electrical pastes including cream solder for soldering the electronic parts, conductive paste for forming circuit patterns and insulating paste are applied by means of screen printing.

In the screen printing, a screen mask is put on a substrate and then a squeegee is made to slide on the screen mask so as to apply the electrical paste through pattern holes formed in the screen mask onto predetermined portions of the substrate.

When performing the screen printing, it is necessary to make accurate positional alignment of the substrate and screen mask, and therefore the positional alignment of the substrate and screen mask will precede the screen printing. The term of "positional alignment" mentioned in this specification means to obtain relative positional discrepancy between the substrate and the screen mask which is to be used as reference when the screen mask is replaced by a new one or when the screen mask is replaced by that for the next model at the of model change. Heretofore, such positional alignment has been performed in the following manner. Namely, an operator observes peculiar portions of the screen mask with a camera while moving the camera relatively and horizontally with respect to the screen mask so as to perform the teaching about the position of the screen mask. For the substrate as well, its peculiar portions are observed with a camera in the same manner so as to perform the teaching about the position of the substrate. Then, the relative positional discrepancy between the screen mask and substrate is calculated, the result of which is registered in a memory of a computer as position correction data. Thereafter, an actual printed substrate is conveyed so as to undergo the screen printing.

However, according to the conventional method, it has been customary to perform the positional alignment of the substrate and the screen mask while moving the camera horizontally with respect to the screen mask and the substrate by the hand of the operator, so that lots of time and labor were required and errors appeared easily depending on the degree of skill of the operator.

OBJECT AND SUMMARY OF THE INVENTION

It is therefore an object of the present invention to provide a method of automatic positional alignment of substrate and screen mask in electrical paste screen printing.

In accordance with the present invention, a method of positional alignment of substrate and screen mask in electrical paste screen printing comprising the steps of: moving a substrate relatively and horizontally with respect to a camera to observe two peculiar portions of the substrate with the camera so as to register the position data of the peculiar portions into a substrate recognition result data storage section; moving a screen mask relatively and horizontally with respect to a camera to observe two peculiar portions of the screen mask with the camera so as to register the position data of the peculiar portions into a screen mask recognition result data storage section; obtaining relative positional discrepancies between the substrate and the screen mask in the directions of X and Y through the calculation in a control section based on the two position data so as to register the results of the calculation into a position correcting calculation result storage section; and obtaining a line segment connecting the two peculiar portions of the substrate and a line segment connecting the two peculiar portions of the screen mask and obtaining a relative angle between the obtained two line segments through the calculation in the control section so as to register the result of the calculation into the position correcting calculation result storage section.

With the construction described above, the position data of the substrate and the screen mask can be obtained while moving the cameras relatively and horizontally with respect to the substrate and the screen mask, and the relative positional discrepancies between the substrate and the screen mask in the directions of X, Y and θ can be automatically obtained based on the position data obtained. Further, by making use of the obtained positional discrepancies as the position correction data, it is possible to perform the electrical paste printing with the substrate and the screen mask matched completely with each other.

BRIEF DESCRIPTION OF THE DRAWINGS

FIG. 5A is a table showing the position data of the substrate according to one embodiment of the invention;

FIG. 5B is a table showing the position data of the screen mask according to one embodiment of the invention;

FIG. 5C is a table showing the data of positional discrepancy calculation result according to one embodiment of the invention;

FIGS. 9A and 9B are illustrations showing the manner of judging whether or not the positional alignment of substrate and screen mask is successful according to one embodiment of the invention.

DESCRIPTION OF THE PREFERRED EMBODIMENT

Figure 1:
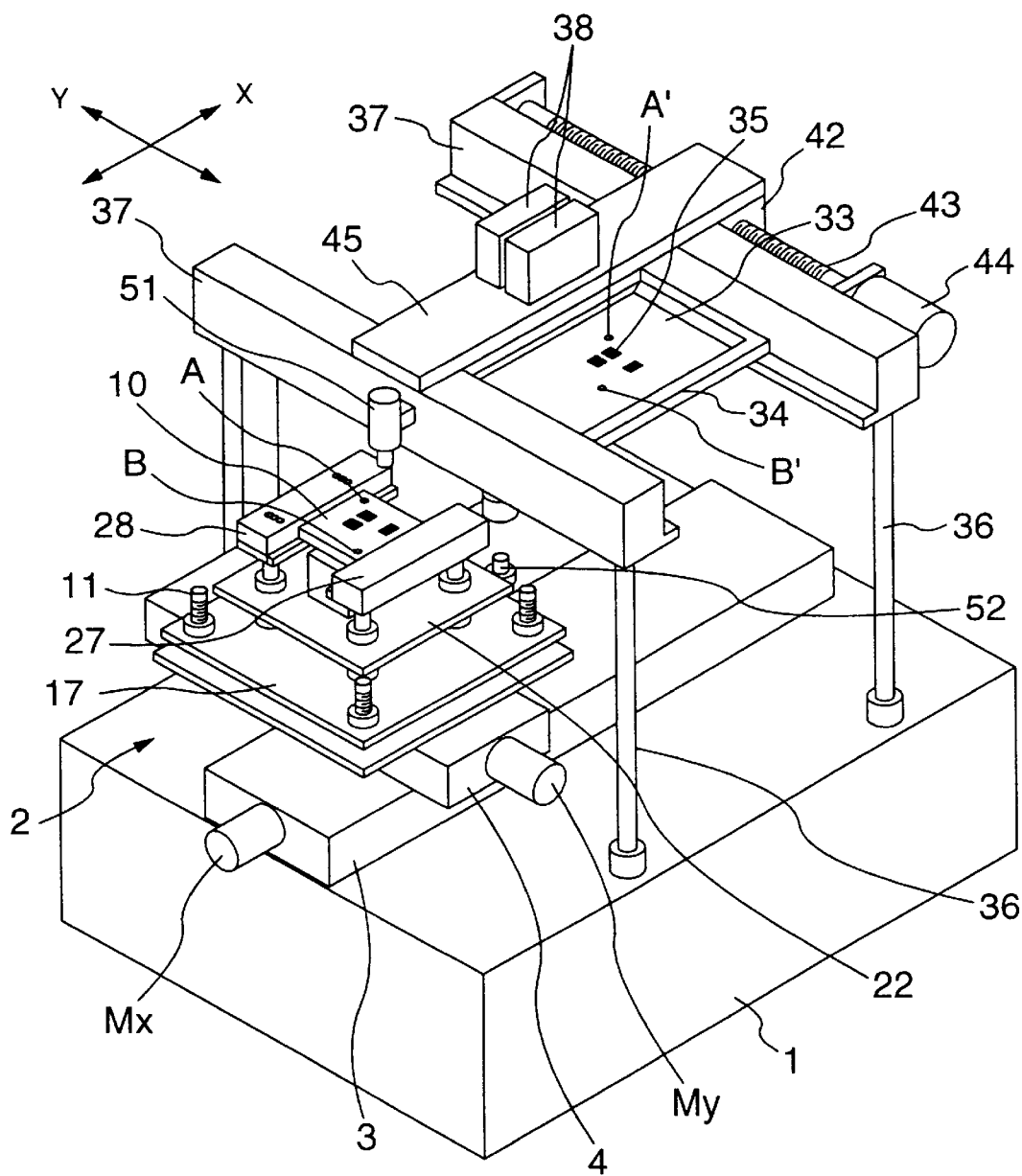
FIG. 1 is a perspective view of an electrical paste screen printing apparatus according to one embodiment of the invention.
Figure 2:
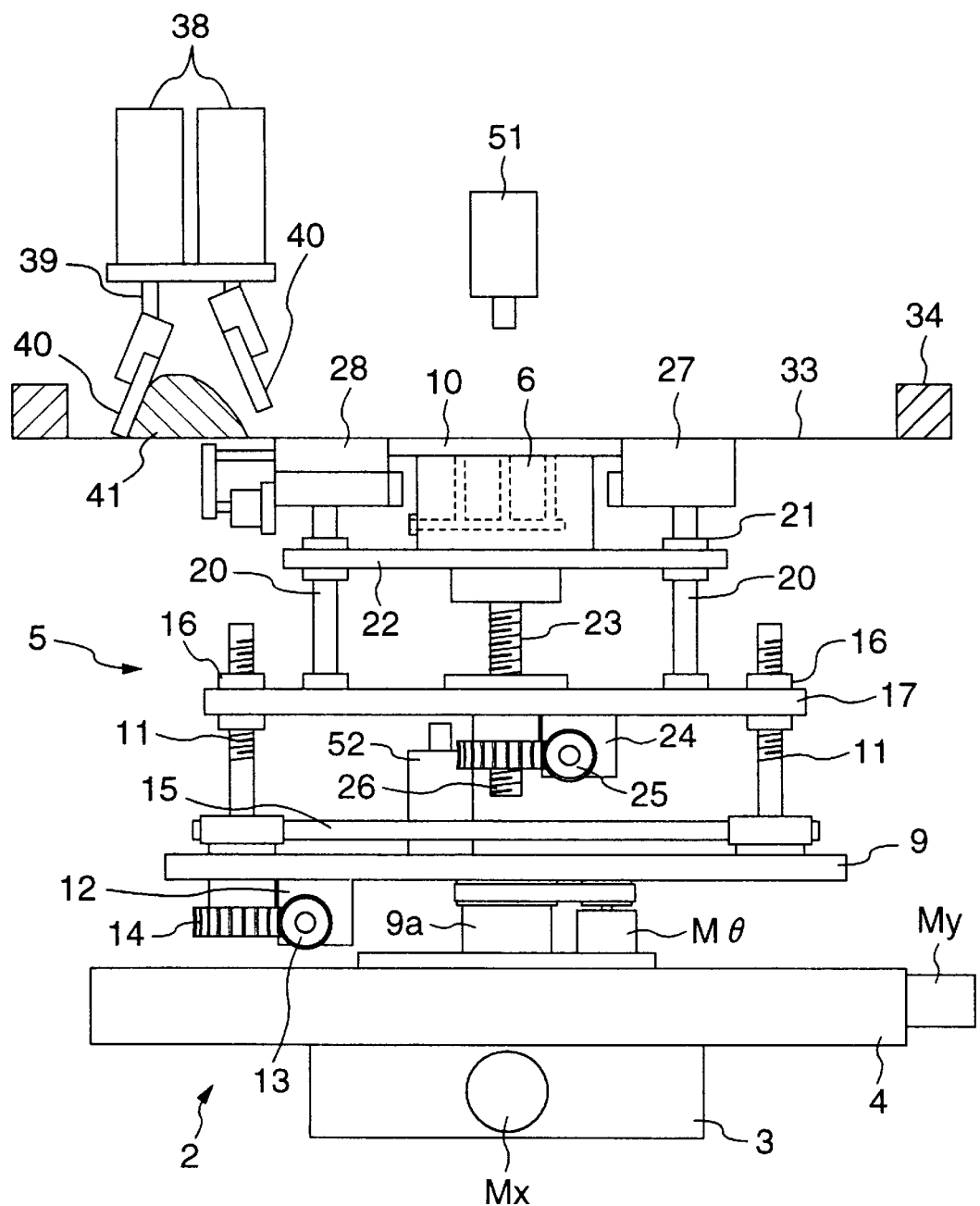
FIG. 2 is a side view of the electrical paste screen printing apparatus according to one embodiment of the invention.
Figure 3:
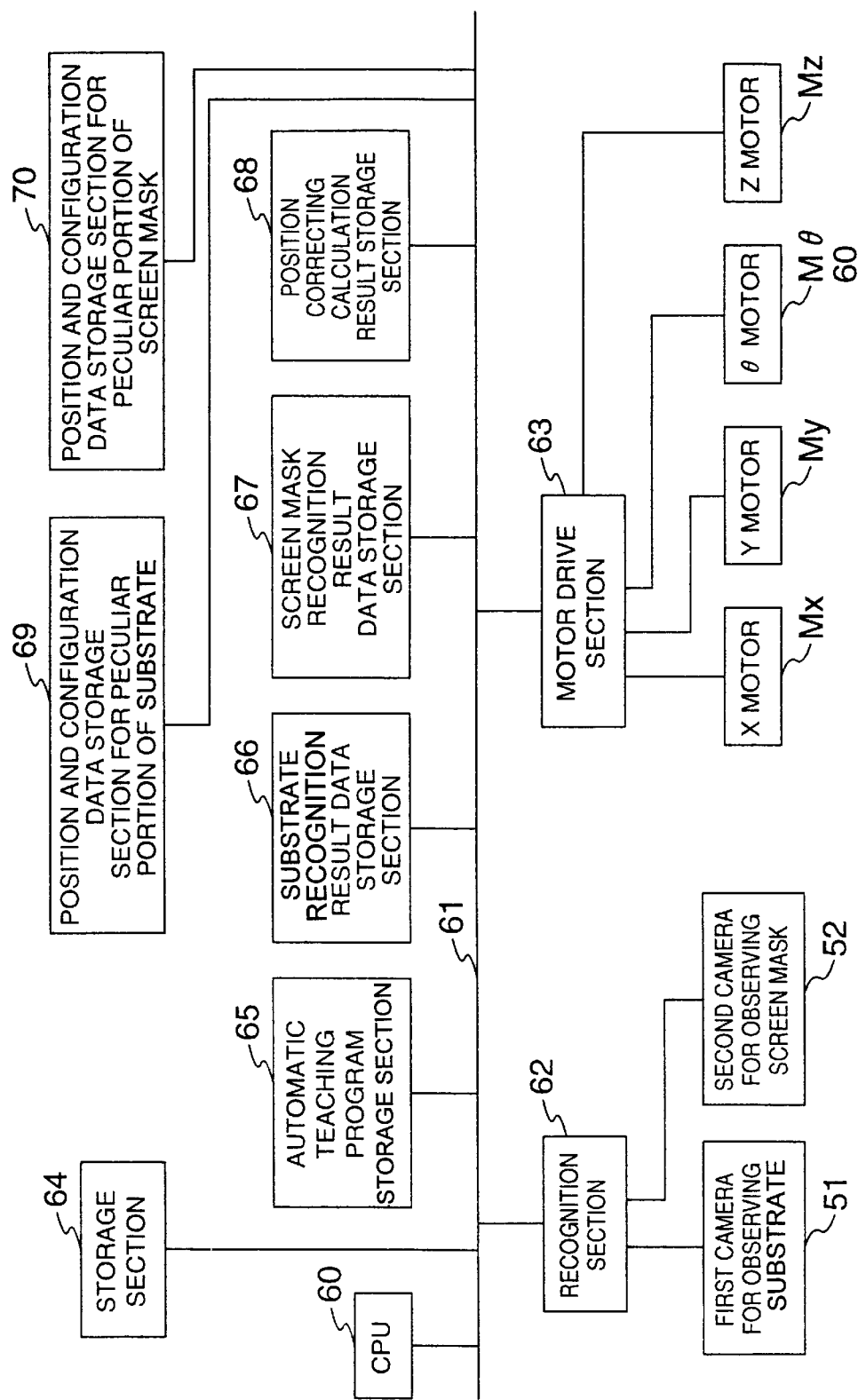
FIG. 3 is a block diagram of the control system of the electrical paste screen printing apparatus according to one embodiment of the invention.
Figure 4:
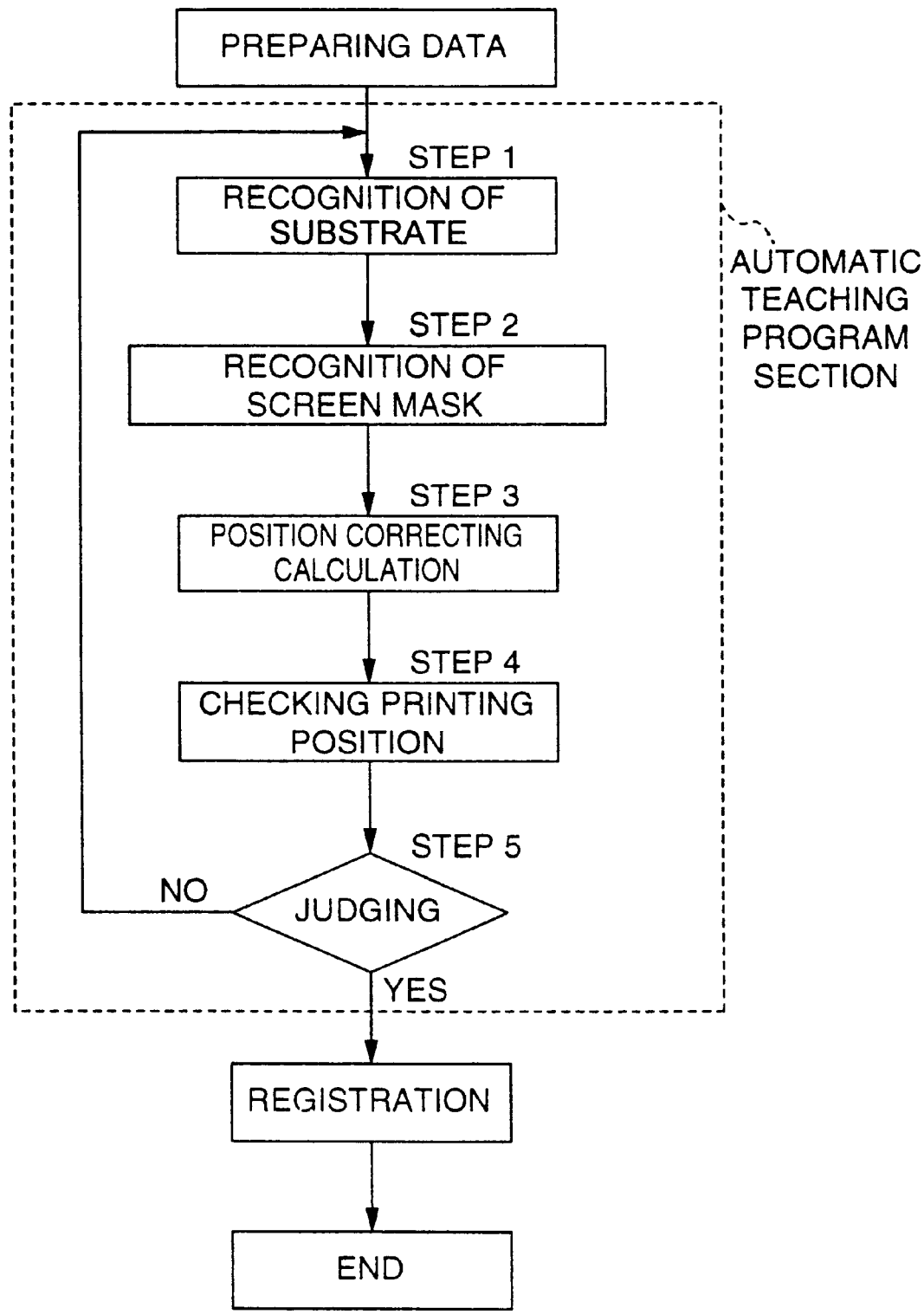
FIG. 4 is a flow chart showing the operation of positional alignment of substrate and screen mask according to one embodiment of the invention.
Figure 6:
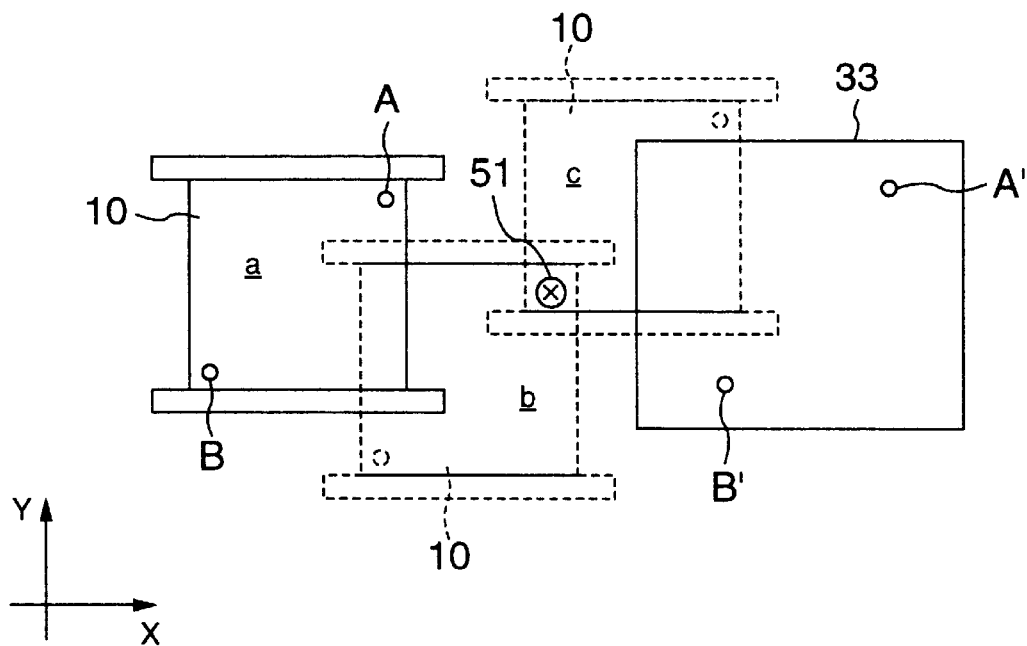
FIG. 6 is an illustration showing the manner of observation of the substrate according to one embodiment of the invention.
Figure 7:
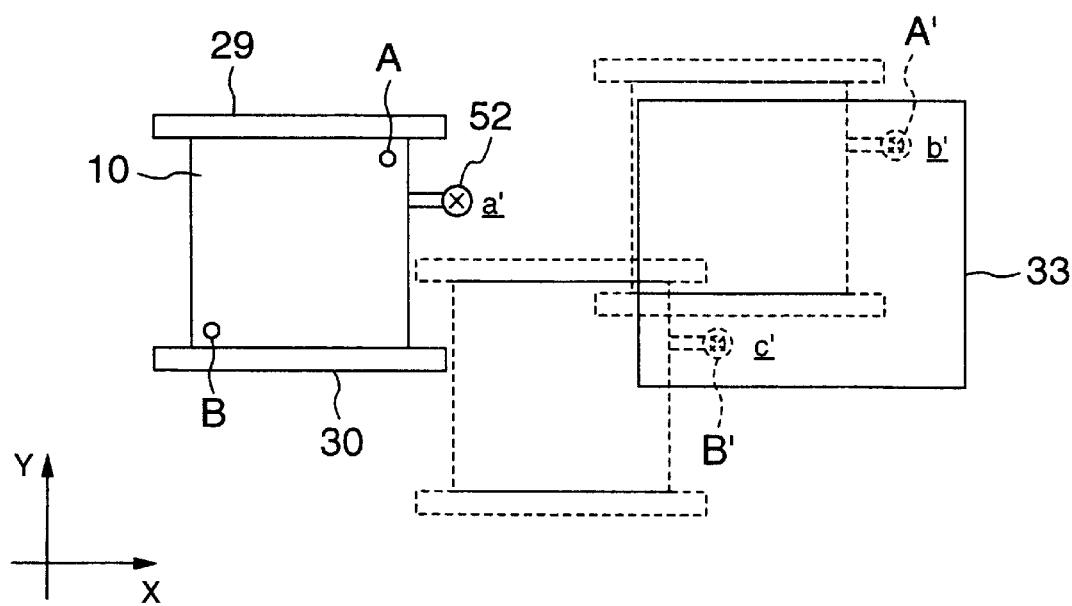
FIG. 7 is an illustration showing the manner of observation of the screen mask according to one embodiment of the invention.
Figure 8:
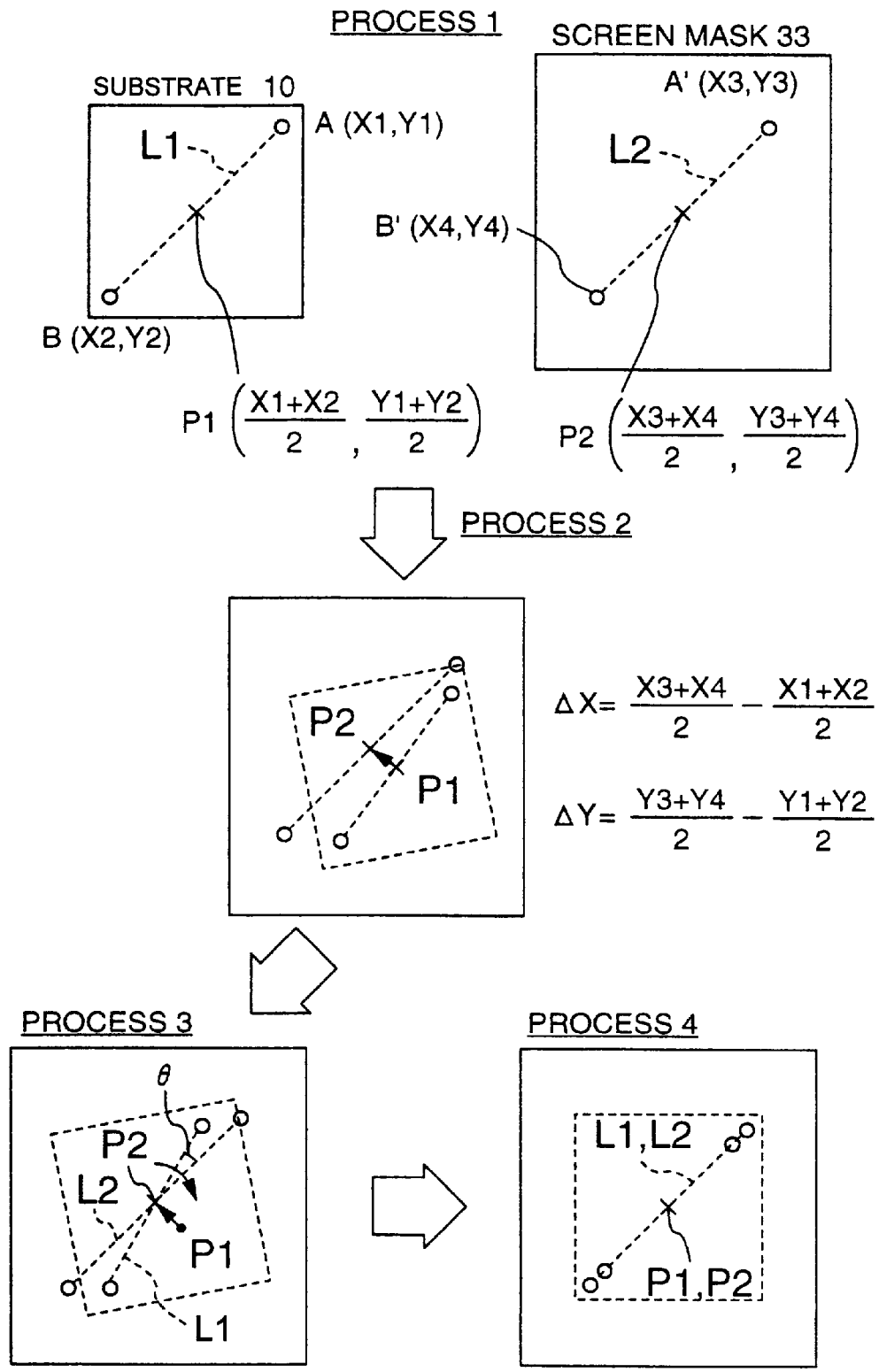
FIG. 8 is an illustration showing the manner of detection of positional discrepancies between the substrate and the screen mask in the directions of X, Y and θ according to one embodiment of the invention.

Now, description will be given of an embodiment of the present invention with reference to the drawings. FIG. 1 is a perspective view of an electrical paste screen printing apparatus according to one embodiment of the invention, FIG. 2 is a side view of the electrical paste screen printing apparatus according to the same embodiment, and FIG. 3 is a block diagram of the control system of the electrical paste screen printing apparatus according to the same embodiment. FIG. 4 is a flow chart showing the operation of positional alignment of substrate and screen mask according to the same embodiment, FIG. 5A is a table showing the position data of the substrate according to the same embodiment, FIG. 5B is a table showing the position data of the screen mask according to the same embodiment, FIG. 5C is a table showing the data of positional discrepancy calculation result according to the same embodiment, FIG. 6 is an illustration showing the manner of observation of the substrate according to the same embodiment, FIG. 7 is an illustration showing the manner of observation of the screen mask according to the same embodiment, FIG. 8 is an illustration showing the manner of detection of positional discrepancies between the substrate and the screen mask in the directions of X, Y and θ according to the same embodiment, and FIGS. 9 are illustrations showing the manner of judging whether or not the positional alignment of substrate and screen mask is successful according to the same embodiment.

First, referring to FIGS. 1 to 3, the general construction of the electrical paste screen printing apparatus will be described. The structure of the screen printing apparatus shown in FIGS. 1 and 2 is well known, and therefore brief description will be given of the structure. In FIGS. 1 and 2, a movable table 2 is mounted on a base 1. The movable table 2 comprises an X-table 3, a Y-table 4, a Z-table 5 and a substrate holding portion 6 which are disposed in tiers. Further, the movable table 2 has a θ-table 9 which causes a substrate 10 on the substrate holding block 6 to make θ-rotation (horizontal rotation). Reference characters Mx, My and Mθ denote motors for driving the X-table 3, Y-table 4 and θ-table 9, respectively, and reference numeral 9a denotes a transmission portion of the motor Mθ.

In FIG. 2, the Z-table 5 comprises vertical feed screws 11 provided upright on the θ-table 9, a motor 12 for rotating the feed screws 11, gears 13 and 14, a belt 15 for transmitting the rotation of one of the feed screws 11 to the others and so on. Further, a first elevator plate 17 is held by the feed screws 11 through the medium of nuts 16. Therefore, as the motor 12 is driven to rotate the feed screws 11, the elevator plate 17 is moved up and down.

Guide rods 20 are provided upright on the elevator plate 17, and a second elevator plate 22 is held by the guide rods 20 through the medium of guide rings 21. A vertical feed screw 23 is provided upright on the first elevator plate 17, and the feed screw 23 is rotated by a motor 24 and gears 25, 26 mounted on the elevator plate 17. The second elevator plate 22 is connected to the upper end portion of the feed screw 23. Therefore, when the motor 24 is driven to rotate the feed screw 23, the second elevator plate 22 is moved up and down.

The substrate holding portion 6 is disposed on the upper surface of the second elevator plate 22. The substrate 10 is placed on the substrate holding portion 6 and clamped from both sides with right and left clamp units 27, 28 so as to be fixed. One clamp unit 28 is a movable damper so that when it is moved back and forth laterally (in the transverse direction in FIG. 2), the substrate 10 is clamped and unclamped.

In FIGS. 1 and 2, a screen mask 33 is held by a frame-shaped holder 34 and formed therein with open pattern holes 35. Support posts 36 are provided upright on the base 1, and support frames 37 are supported by the support posts 36. A slide plate 45 is installed to extend over the left and right support flames 37, and two cylinders 38 are provided on the slide plate 45. A squeegee 40 is connected to a rod 39 of each cylinder 38 so that when the cylinder 38 is operated to make the rod 39 come in and out, the squeegee 40 is moved up and down. Reference numeral 41 denotes an electrical paste, such as cream solder, deposited on the screen mask 33. A nut 42 is fixed to an end portion of the slide plate 45. A feed screw 43 is screwed into the nut 42. When a motor 44 is driven to rotate the feed screw 43, the slide plate 45 is caused to slide in the direction of Y and therefore the squeegee 40 is caused to slide on the screen mask 33 in the same direction.

A first camera 51 for observing substrate is attached to the support frame 37. Further, a second camera 52 for observing screen mask is attached to the Y-table 4. When the X-table 3 and the Y-table 4 are driven, the substrate 10 on the movable table 2 moves relatively and horizontally in the directions of X and Y with respect to the first camera 51, during which points A and B forming the peculiar portions of the substrate 10 are observed from above with the first camera 51. Similarly, when the X-table 3 and the Y-table 4 are driven, the second camera 52 moves horizontally in the directions of X and Y under the screen mask 33, during which points A' and B' forming the peculiar portions of the screen mask 33 are observed from below with the second camera 52. The points A and B are formed on a diagonal line of the substrate 10 as a spot. Meanwhile, the points A' and B' are openings formed in those positions corresponding to the points A and B as a spot.

Next, description will be given of the control system with reference to FIG. 3. Reference numeral 60 denotes a control section such as CPU. The following elements are connected to the control section 60 through a bus 61. The control section 60 performs the control of the whole apparatus, necessary calculation/decision and so on.

Reference numeral 62 denotes a recognition section to which the first and second cameras 51, 52 are connected. Reference numeral 63 denotes a motor driving section to which the aforesaid motors Mx, My, Mz, Mθ are connected. Reference numeral 64 denotes a storage section for storing various data and the like. Reference numeral 65 denotes an automatic teaching program storage section in which a program for automatic positional alignment of the substrate 10 and the screen mask 33 is registered.

Reference numeral 66 denotes a substrate recognition result data storage section in which the position data (values for X-coordinate, Y-coordinate) and configuration data of the points A and B forming the peculiar portions of the substrate, obtained as a result of the observation with the first camera 51, are stored. Reference numeral 67 denotes a screen mask recognition result data storage section in which the position data (values for X-coordinate, Y-coordinate) and configuration data of the points A' and B' forming the peculiar portions of the screen mask 33, obtained as a result of the observation with the second camera 52, are stored.

Reference numeral 68 denotes a position correcting calculation result storage section. The control section 60 performs the calculation of relative positional discrepancies between the points A, B on the substrate 10 and the points A', B' on the screen mask 33 in the directions of X, Y and θ based on the position data thereof. The results of this calculation are stored in the position correcting calculation result storage section 68 as the correction data for positional alignment of the substrate 10 and the screen mask 33.

Reference numeral 69 denotes a position and configuration data storage section for peculiar portion of substrate in which the coordinate and configuration data of the points A, B forming the peculiar portions of the substrate 10 are stored. Reference numeral 70 denotes a position and configuration data storage section for peculiar portion of screen mask in which the coordinate and configuration data of the points A', B' forming the peculiar portions of the screen mask 33 are stored.

The screen printing apparatus of this embodiment is constructed as described above, and description will now be given of the method of automatic positional alignment of the substrate 10 and the screen mask 33. FIG. 4 is a flow chart thereof. In FIG. 1, the substrate 10 is brought onto the movable table 2 by means of a conveyor (not shown) and positioned by being clamped with the clamp units 27, 28, and thereafter the recognition of substrate is performed (step 1 in FIG. 4). The recognition of substrate is performed in the following manner. In FIG. 1, the substrate 10 is moved in the directions of X and Y by driving the movable table 2, and the points A and B are observed from above with the first camera 51 one by one.

FIG. 6 shows the manner of observation of substrate. The substrate 10 is moved from its initial position a to a position b where the point A is observed with the first camera 51. Then, the substrate 10 is moved from the position b to a position c where the point B is observed with the first camera 51. FIG. 5A shows the data obtained as a result of this observation and stored in the substrate recognition result data storage section 66. The points A and B are circular in plan, having a diameter of 1 mm.

Then, recognition of screen mask is performed (step 2). The recognition of screen mask is performed in the following manner. By driving the movable table 2, the second camera 52 attached to the Y-table 4 is moved to be located under the screen mask 33 for observing the points A' and B'. FIG. 7 shows the manner of this recognition of screen mask. The movable table 2 is driven to cause the second camera 52 to move from its initial position a' to a position b' where the point A' on the screen mask 33 is observed. Then, the second camera 52 is moved from the position b' to a position c' where the point B' is observed. FIG. 5B shows the data obtained as a result of this observation and stored in the screen mask recognition result storage section 67. The points A' and B' are circular, having a diameter of 1 mm.

On completion of the recognition of substrate and screen mask, the position correcting calculation is performed (step 3). FIG. 8 shows the details of the step 3 in the order of processing as indicated by arrow marks. The details of the step 3 will be described below by referring to FIG. 8. First in process 1, the coordinates (X1+X2/2, Y1+Y2/2) of the middle point P1 of a line segment L1 connecting the point A (X1, Y1) to the point B (X2, Y2) on the substrate 10 are calculated. Further, the coordinates (X3+X4/2, Y3+Y4/2) of the middle point P2 of a line segment L2 connecting the point A' (X3, Y3) to the point B' (X4, Y4) on the screen mask 33 are calculated.

Subsequently, in process 2, positional discrepancies ΔX and ΔY between the middle points P1 and P2 in the directions of X and Y are calculated. ΔX=(X3+X4/2)−(X1+X2/2), ΔY=(Y3+Y4/2)−(Y1+Y2/2). The positional discrepancies ΔX and ΔY are stored in the position correcting calculation result storage section 68 as the data shown in FIG. 5C.

Thereafter, in process 3, the middle points P1 and P2 are superposed. At this time, the line segment L1 connecting the point A to the point B is deviated from the line segment L2 connecting the point A' to the point B1 by an angle θ. To cope with this, in process 4, the θ-table is driven to cause the substrate 10 to rotate relatively and horizontally with respect to the screen mask 33 until the line segments are superposed. The angle θ can be found out from this angle of horizontal rotation. The angle θ thus obtained is also stored in the position correcting calculation result storage section 68 as the data shown in FIG. 5C.

As a result of the processes mentioned above, the positional discrepancies between the substrate 10 and the screen mask 33 in the directions of X, Y and θ can be found out. Then, according to the data stored in the position correcting calculation result storage section 68, the movable table 2 is driven to make the substrate 10 move to the printing position just below the screen mask 33, where the substrate 10 and the screen mask 33 are superposed for checking the printing position (step 4), and then it is judged whether or not the positional alignment is successful (step 5).

FIGS. 9 are illustrations for explaining the manner of judging whether the positional alignment is successful or not. If the points A and A' coincide with each other as shown in FIG. 9A, it is judged to be successful, while if the points A and A' are deviated from each other beyond the allowable value as shown in FIG. 9B, it is judged to be unsuccessful. Such judgement may be performed based on the observation with the eye of an operator, or may be performed automatically by the control section 60 based on the observation with a camera provided above the screen mask 33. Further, it is advisable to make the judgement shown in FIGS. 9 on the points B and B' as well, and the judgement may be performed by making use of the pattern opening in the screen mask and the printing position on the substrate.

As has been described above, according to the present invention, it is possible to automatically perform the positional alignment of substrate and screen mask.

We claim:

1. A method of positional alignment of substrate and screen mask in electrical paste screen printing, comprising the steps of:

moving a substrate relatively and horizontally with respect to a camera to observe two peculiar portions of said substrate with said camera so as to register the position data of said peculiar portions into a substrate recognition result data storage section;

moving a screen mask relatively and horizontally with respect to a camera to observe two peculiar portions of said screen mask with said camera so as to register the position data of said peculiar portions into a screen mask recognition result data storage section;

obtaining relative positional discrepancies between said substrate and said screen mask in the directions of X and Y through the calculation in a control section based on said two position data so as to register the results of said calculation into a position correcting calculation result storage section; and obtaining a line segment connecting the two peculiar portions of said substrate and a line segment connecting the two peculiar portions of said screen mask and obtaining a relative angle between the obtained two line segments through the calculation in the control section so as to register the result of said calculation into the position correcting calculation result storage section.

2. A method according to claim 1, wherein configuration and size of the peculiar portions of the substrate are stored in said substrate recognition result data storage section.

3. a method according to claim 1, wherein configuration and size of the peculiar portions of the screen mask are stored in said screen mask recognition result data storage section.

4. A method according to claim 1, wherein the printing position is checked by superposing the screen mask and the substrate which have been moved relatively based on the data stored in said position correcting calculation result storage section.

* * * * *